United States Patent
Verhaar et al.

(10) Patent No.: US 6,174,759 B1
(45) Date of Patent: Jan. 16, 2001

(54) METHOD OF MANUFACTURING A SEMICONDUCTOR DEVICE

(75) Inventors: Robertus D. J. Verhaar, Eindhoven (NL); Joachim C. H. Garbe, Schenefeld (DE); Guido J. M. Dormans, Eindhoven (NL)

(73) Assignee: U.S. Philips Corporation, New York, NY (US)

( * ) Notice: Under 35 U.S.C. 154(b), the term of this patent shall be extended for 0 days.

(21) Appl. No.: 09/304,412

(22) Filed: May 3, 1999

(30) Foreign Application Priority Data

May 4, 1998 (EP) .................................................. 98201434

(51) Int. Cl.[7] ..................... H01L 21/8234; H01L 21/336; H01L 21/425
(52) U.S. Cl. ......................... 438/201; 438/257; 438/258; 438/307; 438/529
(58) Field of Search .................................... 438/201, 257, 438/258, 307, 527, 529, 943

(56) References Cited

U.S. PATENT DOCUMENTS

| | | | |
|---|---|---|---|
| 4,590,665 | * | 5/1986 | Owens et al. . |
| 5,292,681 | * | 3/1994 | Lee et al. . |
| 5,395,778 | | 3/1995 | Walker ................................... 437/43 |
| 5,427,966 | * | 6/1995 | Komori et al. . |
| 5,783,471 | * | 7/1998 | Chu . |
| 5,911,105 | * | 6/1999 | Sasaki . |
| 6,069,033 | * | 5/2000 | Verhaar et al. . |

* cited by examiner

Primary Examiner—John F. Niebling
Assistant Examiner—Ron Pompey
(74) Attorney, Agent, or Firm—Steven R. Biren

(57) ABSTRACT

In the manufacture of integrated circuits with an embedded non-volatile memory, it is known to first provide the greater part of the memory and subsequently provide the CMOS logic in a second series of steps of a standard CMOS process. By virtue of this separation of process steps, it is possible to optimize the non-volatile memory substantially without degrading the logic. According to the invention, this process is further optimized in that, particularly for the periphery of the memory, and simultaneously with the memory transistors (21, 24, 27), transistors are manufactured which can cope with a higher voltage than the transistors of the logic. In the case of an EEPROM, each cell of the memory is provided with such a high-voltage transistor as a selection transistor (22, 24). Apart from the n-well implantation (5), high-voltage transistors of the p-channel are largely manufactured by means of the same process steps as the p-channel transistors in the logic, so that the number of process steps remains limited. By adding a single mask, the circuit may also be provided with a Flash or an OTP (One Time Programmable) memory.

10 Claims, 5 Drawing Sheets

METHOD OF MANUFACTURING A SEMICONDUCTOR DEVICE

BACKGROUND OF THE INVENTION

The invention relates to a method of manufacturing a semiconductor device, in which a semiconductor body is provided at a surface with a low-voltage field effect transistor and with a non-volatile memory cell in the form of a field effect transistor with a floating gate, in which method the surface is provided with a dielectric layer on which a first polycrystalline or amorphous silicon layer (further referred to as poly) is deposited which is patterned at the location of the memory cell to be formed, whereafter a first doping step is performed for forming source and drain zones of the memory cell, while, during said doping step, the region where the low-voltage transistor is formed is masked against doping by the poly layer, and in a subsequent series of steps the poly layer is patterned at the area of the low-voltage transistor, and source and drain zones of the low-voltage transistor are formed by means of a second doping step. Such a method is known from, inter alia U.S. Pat. No. 5,395,778.

For special uses, for example for microcontrollers or for chip cards, integrated circuits are nowadays required in which logic intended for the conventional data processing is combined with non-volatile memory space for the purpose of data storage. For the logic, use is preferably made of a standard CMOS process with which transistors having optimum properties can be obtained. Generally, these transistors are designed for operation at a relatively low voltage, i.e. at a voltage of less than, for example 5 V. The memory consists of memory cells each comprising a transistor with a floating gate. Usually, a control gate, which is electrically separated from the floating gate by means of an intermediate insulating layer, is arranged above this floating gate. Written information is represented by the charge state of the floating gate which determines the threshold voltage of the transistor. The information can be read by determining the conduction of current through the transistor at a given voltage across the control gate.

Said U.S. Pat. No. 5,395,778 describes a method in which, with a minimal number of extra process steps, a CMOS circuit made in a standard CMOS process is combined with a non-volatile memory in a common silicon body. Since the manufacture of such a non-volatile memory is not compatible with a standard CMOS process, said U.S. Pat. No. 5,395,778 proposes a method in which first a series of essential steps is performed for manufacturing the memory, such as the definition of the floating gate from a polycrystalline silicon layer (poly silicon), a doping step for the source/drain and an oxidation step for oxidizing the side walls of the floating gate. During these steps, the active regions of the semiconductor body where the logic is provided are entirely masked by the poly layer. When the essential steps of providing the memory have been performed, the process can be continued with the standard CMOS process for the logic.

In certain types of non-volatile memories, it is desirable to use voltages which are higher than 5 V, for example a voltage of 9–20 V. This situation occurs, for example in memories of the EEPROM type in which use is made of the Fowler-Nordheim tunnel mechanism during writing and/or erasing. To supply such relatively high voltages, the peripheral electronics of the memory require transistors which can cope with these high voltages and must therefore have a breakdown voltage of approximately 14 V. In addition to these transistors, here referred to as high-voltage transistors, each cell in an EEPROM is usually provided with an access transistor which isolates the memory cell electrically from other memory cells and connects the floating gate transistor to a bit line, and which should also be able to cope with said high voltage. This transistor is usually of the same conductivity type as the memory transistor.

SUMMARY OF THE INVENTION

It is, inter alia, an object of the invention to provide a method of the type described in the opening paragraph, in which a non-volatile memory can be combined with a standard CMOS process, and in which also high-voltage transistors can be realized without any noticeable deterioration of quality of the low-voltage transistors of the CMOS logic. It is a further object of the invention to realize these high-voltage transistors in a minimal number of extra process steps.

According to the invention, a method of the type described in the opening paragraph is characterized in that the semiconductor body is also provided with a high-voltage field effect transistor having a gate which is patterned simultaneously with the floating gate of the memory cell, while, during the first doping step, the semiconductor body is doped also at the area of the source and drain zones of the high-voltage transistor, whereafter edges of the gate of this transistor are provided with spacers and, during the subsequent, second doping step, higher doped parts are formed in non-masked parts of the source and drain zones of the high-voltage transistor. Since the first doping step is independent of the CMOS transistors, this step may be performed in such a way, for example as regards concentration and/or implantation energy, that a favorable breakdown voltage is obtained in the high-voltage transistor. Since the source/drain doping step for the high-voltage transistor can be performed simultaneously with the source/drain doping in the memory cell, it is possible to limit the number of process steps. Since the logic region is covered with poly, it is possible to cover the walls of the floating gate and the gate of the high-voltage transistor with an oxide layer by means of an oxidation step which is optimized for this part of the process, inter alia, in connection with the breakdown voltage, without affecting the logic properties.

A preferred embodiment of a method according to the invention is characterized in that the dielectric layer is provided in the form of a silicon oxide layer having a larger thickness at the area of the high-voltage transistor than at the area of the low-voltage transistor. In most embodiments, the gate oxide of the high-voltage transistor can be formed simultaneously with the gate oxide of the floating gate transistor.

The non-volatile memory may be implemented, for example, as an EPROM, or as a Flash EPROM, etc. Particular advantages are obtained in the case where the memory is of the EEPROM type as described hereinbefore. An important embodiment of a method according to the invention is therefore characterized in that, prior to depositing the poly silicon layer, the silicon oxide layer is locally provided with a tunnel oxide at the location of the memory cell, where the oxide is so thin that charge carriers can move by means of the tunnel effect between the floating gate and the semiconductor body during writing and/or erasing data. A preferred embodiment of such a method, by which the number of process steps can be limited, is characterized in that, simultaneously with the formation of the tunnel oxide, the low-voltage transistor is provided with gate oxide having a thickness which is equal or at least substantially equal to the thickness of the tunnel oxide.

When such a cell is written or erased, a high voltage is usually applied to the drain of the memory transistor. An important embodiment is characterized in that the high-voltage transistor and said low-voltage transistor are provided as transistors of the same conductivity type as the transistor with the floating gate, the high-voltage transistor constituting a selection or access transistor of the memory cell. High-voltage transistors of the same conductivity type in the peripheral electronics of the EEPROM are simultaneously manufactured with the access transistors in the memory cells. An important preferred embodiment of a device according to the invention is therefore characterized in that at least a further high-voltage transistor and at least a further low-voltage transistor of the opposite, complementary, conductivity type are provided, with gates formed from the first silicon layer simultaneously with the gate of the first-mentioned low-voltage transistor. To minimize the number of process steps as much as possible, the high-voltage transistor and the low-voltage transistor of the complementary conductivity type are preferably provided in a common doping step with source and drain zones of the second conductivity type. In this respect, it should be noted that the last-mentioned high-voltage transistors of the complementary conductivity type, usually the p-type, may have a lower breakdown voltage than the first-mentioned high-voltage transistors in conventional implementations of the n-type. This breakdown voltage difference is generally acceptable because the p-channel HV transistors occur only in the periphery. If, in connection with the high voltage to be processed, a higher breakdown voltage for the p-channel HV transistors is required, such a higher breakdown voltage can be achieved by arranging two or more transistors in series. The n-channel HV transistors do not only occur in the periphery but also in the memory section where a selection transistor is required per cell. Replacement of this transistor by two or more series-arranged transistors would lead to an enlargement of the space occupied by the memory, which would be unacceptable in many cases. By decoupling, in accordance with this aspect of the invention, essential process steps for manufacturing the n-channel HV transistors from the process of manufacturing the CMOS logic, and by partly manufacturing the p-channel HV transistors simultaneously with the CMOS logic, the total number of process steps is limited without this leading to a noticeable enlargement of the occupied space.

In an EEPROM, each memory cell is provided with an access transistor which can be manufactured as a high-voltage transistor in the manner described. Such a cell has, inter alia, the advantage that it is possible to write and erase the cell many times. Moreover, the cell is randomly selectable. Per memory cell, however, two transistors occupying a relatively large space are required. In practice, it often occurs that, for storing certain data, simpler and hence smaller memory cells are sufficient which are writable/erasable only once or several times (for example, OTP), or cells which can at most be selected per block (flash). A further embodiment of a method according to the invention, providing the possibility of integrating also such memory cells in the circuit with relatively few extra process steps, is characterized in that, in addition to said memory cell, further referred to as first memory cell, a non-volatile memory cell in the form of a transistor with a floating gate, further referred to as second memory cell, is provided, which is of a type in which writing or erasing takes place by means of hot electrons generated in the channel of the transistor during operation, the floating gate of the second memory cell being defined in a stage where the region of the low-voltage transistor is covered by the polycrystalline silicon layer, and where in the same stage a third doping step is performed so as to obtain source and drain zones of the second memory cell, the third doping step being performed with a higher dose than the first doping step. A preferred embodiment is characterized in that the floating gate and the third doping step are defined prior to defining the floating gate of the first memory cell and the gate of the high-voltage transistor.

These and other aspects of the invention are apparent from and will be elucidated with reference to the embodiments described hereinafter.

DESCRIPTION OF THE PREFERRED EMBODIMENTS

Figure 1:
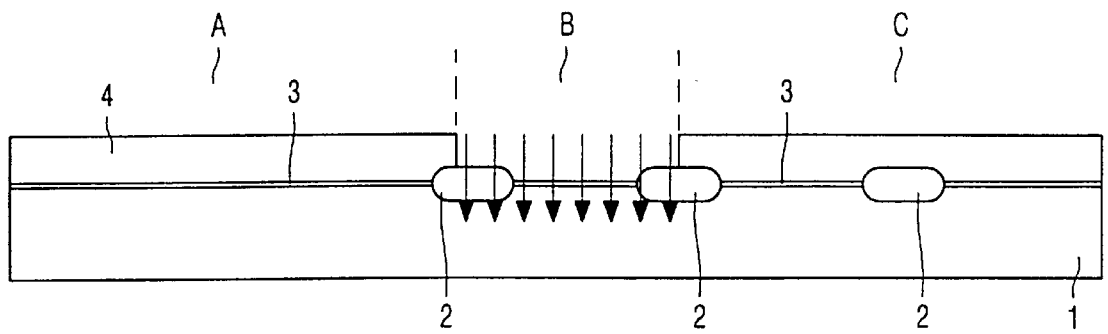
FIGS. 1–14 show a series of stages of a first implementation of a method according to the invention.

It is to be noted that the drawing is only diagrammatic and not to scale. Furthermore, three regions denoted A, B and C can be distinguished in the cross-sections. An EEPROM cell with the associated access or selection transistor is provided in region A. A p-channel high-voltage transistor is provided in region B, and region C serves for the logic (n and p-channel transistors). The n-channel high-voltage transistors are made in the same way as the access transistor of the EEPROM cell.

The method starts from a semiconductor body 1, at least the indicated surface region of which is p-type doped. In a conventional manner, for example by means of local oxidation, the body 1 is provided with a pattern 2 of field oxide having a thickness of, for example 500 nm which defines the various active regions A, B, C etc. After the oxidation step, the oxidation mask is removed and replaced by the approximately 40 nm thick oxide layer 3. The implantation mask 4 leaving the body 1 exposed at the location of the p-channel HV transistor (HV is an abbreviation of High Voltage) is provided on this layer in the conventional manner. P-ions are provided in the silicon body by means of implantation at the locations defined by the mask 4 (diagrammatically shown by way of arrows in the drawing) for the n-type well 5 for the p-channel HV transistor in region B. The n-well implantation of the high-voltage p-channel transistor is not performed simultaneously with the n-well implantation for the p-channel transistors of the CMOS logic so that it is possible to adapt the doping profile of the n-well of the HV p-channel transistor to specific high-voltage requirements, particularly regarding the breakdown voltage of the HV p-channel transistors.

Figure 2:
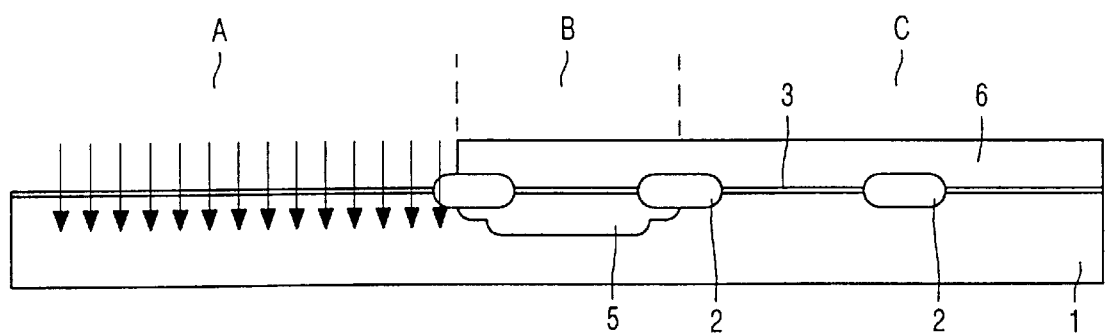

As will be apparent hereinafter, the HV p-channel transistor is otherwise manufactured by means of the same process steps as the p-channel transistors in the CMOS logic. After the implantation, the mask 4 is removed, whereafter the implantation mask 6 (FIG. 2) is provided, which masks the regions B and C and leaves the region A of the memory cell exposed. As will be evident, the mask 6 also leaves regions exposed elsewhere on the silicon body 1 where n-channel HV transistors are required in the peripheral electronics of the EEPROM. The non-masked parts of the semiconductor body, i.e. the region A and regions where further n-channel HV transistors are formed, are p-type doped by means of implantation of boron ions so as to obtain the p-type HV-well 7. Subsequently, the mask 6 is removed.

Figure 3:
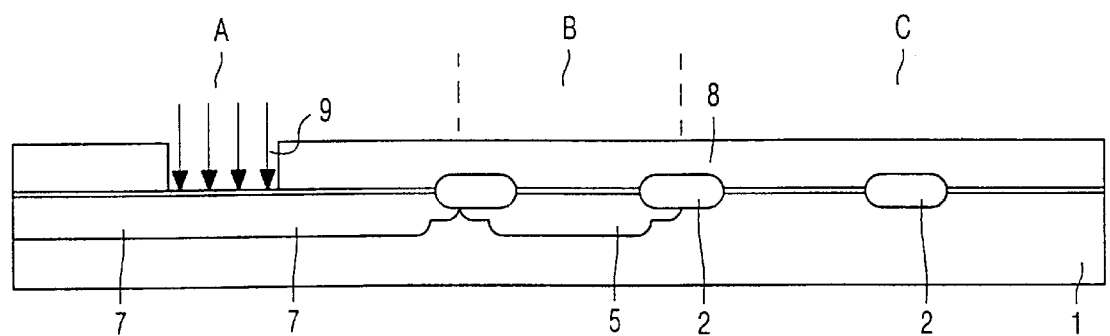

In a subsequent stage, shown in FIG. 3, the implantation mask 8 is provided which has an aperture 9 in the tunnel region to be formed in the EEPROM cell.

Via this aperture, P-ions are implanted in the semiconductor body so as to obtain the n-type injection region 10, whereafter the mask 9 can be removed again. In this stage, the oxide layer 3 can be removed and a new oxide layer 12 having a thickness of, for example, 25 nm can be formed by thermal oxidation. The oxide layer 12 will be the gate oxide in the high-voltage transistors and in the EEPROM cells.

Figure 4:
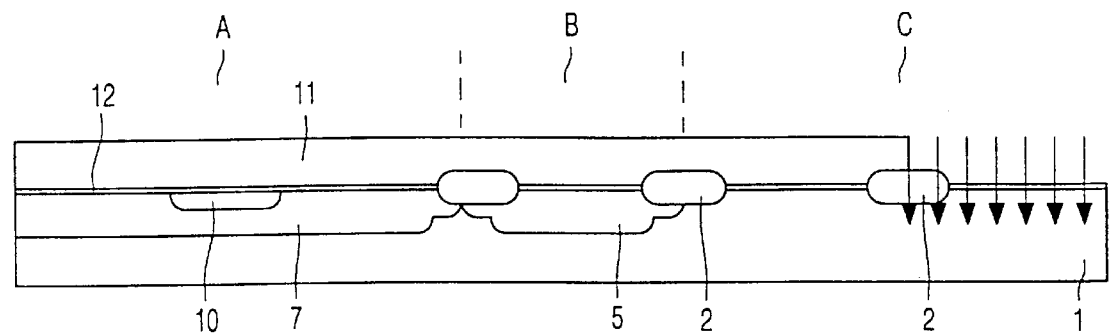
Figure 5:
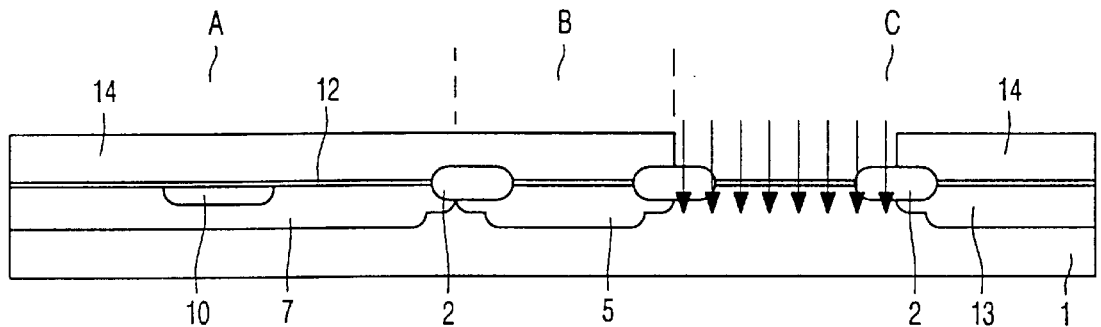
Figure 6:
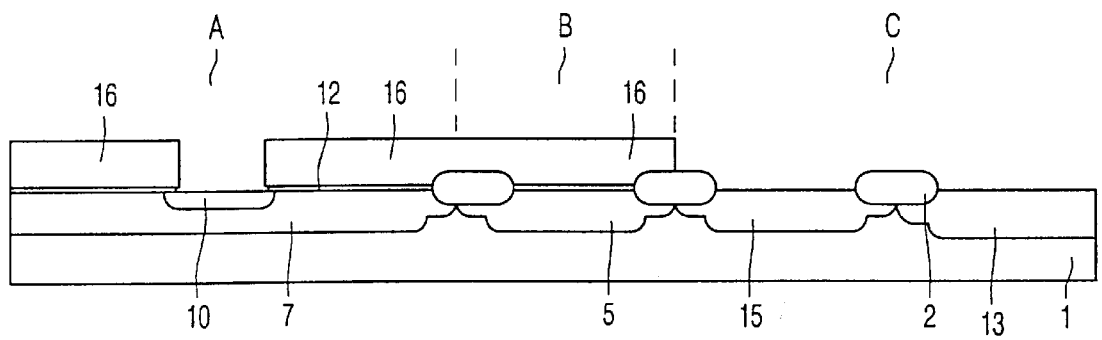

FIG. 4 shows the stage where an implantation mask 11 is provided which leaves the surface exposed in the region where the p-channel transistor of the CMOS logic is provided. By way of implantation, n-type impurities are provided so as to obtain the low-voltage n-type well 13. The low-voltage p-type well 15 is formed similarly by implantation of boron ions via apertures in the implantation mask 14 (FIG. 5). It is to be noted that in this example, as shown in the drawing, the last two implantations are performed only in region C of the logic. In a variant (not shown) of this process, these implantations may be alternatively used to form extra channel stopper zones under the field oxide in the high-voltage region B and in the EEPROM region A under the field oxide 2.

Figure 7:
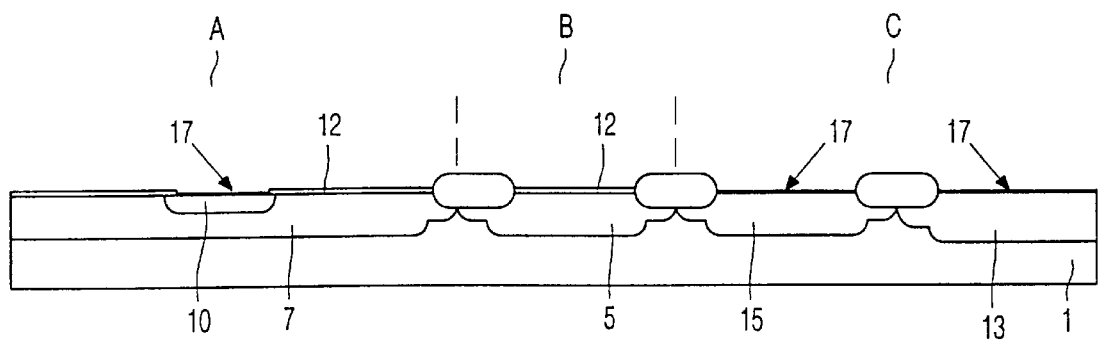

In a subsequent stage of the process, an etching mask 16 is formed on the surface which masks the oxide layer 12 at the location of the high-voltage transistors and the memory cell minus the injection region 10. The non-masked parts of the oxide layer at the area of the logic and the injection region are then etched off, whereafter the etching mask 16 is removed again. By thermal oxidation, a new layer 17 of silicon oxide having a thickness of, for example approximately 7.5 nm is formed at the areas where the oxide layer 12 has been removed. The thickness of the oxide layer 12 will decrease only to a small extent during this oxidation step. This stage is shown in FIG. 7. It is to be noted that the oxide layer 17 in the CMOS region C forms the gate oxide of the n and p-channel transistors and the tunnel oxide of the memory cells in the region A.

An approximately 250 nm thick amorphous or polycrystalline n-type doped silicon layer 18 is formed in known manner. This layer is provided with a layer 19, for example a 25 nm thick silicon oxynitride layer which has, inter alia, the function of masking the subjacent silicon layer 18 against oxidation. The layers 18, 19 are patterned (see FIG. 8) by means of the etching mask 20. During this etching step, in which the floating gate 21 and the gate 22 of the n-channel high-voltage transistor are defined, the region C in which the logic is formed and the gate oxide 17 in the region C is protected against contamination by the silicon layer 18 and the oxynitride layer 19. The mask 20 also masks the region B of the HV p-channel transistor which is further manufactured entirely or at least substantially entirely parallel to the p-channel transistor of the CMOS logic in region C. The floating gate 21 extends partly across the tunnel oxide 17. The gate 22 of the access transistor is defined simultaneously with the gates of n-channel high-voltage transistors in the peripheral electronics of the memory. After the definition of the gates 21 and 22, the photoresist mask 20 is first removed, whereafter the side walls of the gates are covered with a thin oxide layer 23 (FIG. 9) by means of a light oxidation step. Subsequently, phosphor ions are implanted, with the silicon pattern 18, 22, and 21 as a mask, in the non-masked surface parts of the silicon body so as to obtain the n-type source/drain zones of the memory transistor and the n-type LDD zones of the HV access transistor. In an alternative embodiment, the order of oxidation implantation is reversed, and, in the presence of the mask 20 phosphor is first implanted whereafter the mask 20 is removed and oxide is formed by oxidation on the side walls of the gates.

In a subsequent stage, the oxynitride layer 19 is removed whereafter the assembly is coated with an ONO layer 25 (oxide-nitride-oxide). Subsequently, a 250 nm thick amorphous or polycrystalline silicon layer 26 is deposited and n-type doped by means of, for example phosphor, see FIG. 10. By means of a mask (not shown), the layer 26 is subjected to an etching treatment, during which the control gate 27 separated by the ONO layer 25 from the floating gate 21 is formed in the memory cell. The parts of the silicon layer above the HV transistors and in the region C of the logic are removed. After the mask used in this etching step has been removed, the exposed parts of the ONO layer 25 are also removed, while spacer-shaped parts remain only on the edges of the gate 22 and the poly layer 18. FIG. 11 shows the device in this stage of the process.

Figure 12:
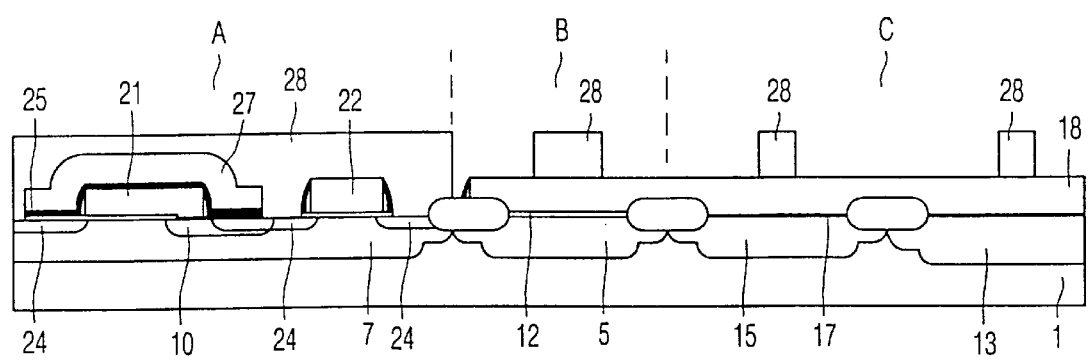
Figure 13:
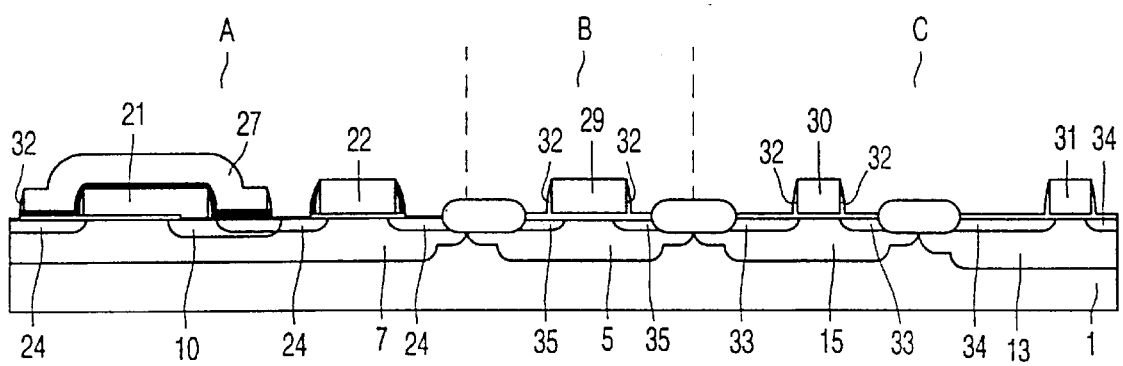

In a subsequent stage, shown in FIG. 12, the mask 28 is provided for patterning the still unpatterned part of the first silicon layer 18 in the regions B (p-channel HV transistor), and in region C (CMOS logic). The silicon of the layer 18 is then patterned by means of etching so that the gates 29 (p-channel HV transistor) in region B and the gates 30 (n-channel transistor of the CMOS logic) and the gates 31 (p-channel transistor of the CMOS logic) are formed, see FIG. 13. After removal of the mask 28, a light oxidation step is performed so as to cover the edges of the gates 29, 30 and 31 with a thin oxide layer 32, see FIG. 13. Subsequently, the n-type LDD source and drain zones 33 of the n-channel lowvoltage transistor of the logic are formed in the p-well 15 by implantation of, for example phosphor ions, followed by the LDD implantation of boron ions in the n-well 13 so as to obtain the p-type LDD zones 34 of the p-channel low-voltage transistor of the logic. Simultaneously, the p-type LDD zones 35 of the p-channel high-voltage transistor are formed in the n-well 5 in the region B.

Figure 14:
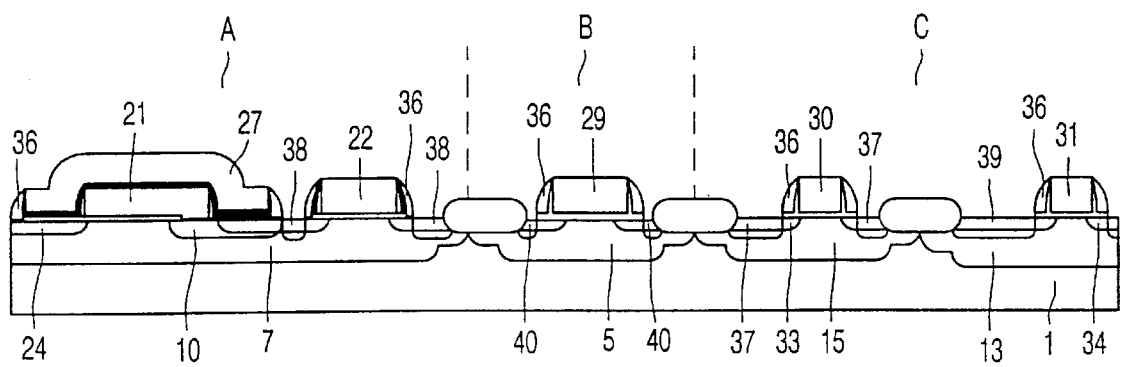

In a subsequent stage, spacers 36 are provided on the side walls of the gates by means of deposition and etching-back, see FIG. 14. Then, an implantation mask (not shown) is provided which leaves exposed the regions of the n-channel transistors of the low-voltage CMOS logic and the regions of the high-voltage n-channel transistors. By implantation of As ions, the highly doped source/drain regions 37 of the n-channel transistors of the CMOS logic and the highly doped n-type source/drain zones 38 of the n-channel HV-transistors are provided. After removal of the mask, a new mask (not shown) is provided and the highly doped p-type source/drain zones 39 of the p-channel low-voltage transistors of the logic and the p-type source/drain zones 40 of the p-channel high-voltage transistors are formed by implantation of boron ions. After removal of the mask, the stage shown in FIG. 14 is reached. The device can then be subjected to further conventional and known treatments such as silicidation and the provision of metal contacts and connections with the associated insulating layers. Such treatments are assumed to be generally known and are therefore not further described.

In the example described, the HV p-channel transistor in region B, with the exception of the n-well, is manufactured simultaneously with the low-voltage p-channel transistor in region C, so that the number of process steps remains limited. The breakdown voltage of the transistor in region B may be slightly lower than that of the HV n-channel transistor and may be, for example 12 V. Since the p-channel transistor only occurs in the periphery and not in the memory section, a higher breakdown voltage can be obtained in a simple manner by arranging two or more of these transistors in series. Since the manufacture of the HV n-channel transistors takes place before the manufacture of the CMOS logic, it is possible to choose the process parameters without degradation of the CMOS logic in such a way that the HV n-channel transistor has the desired properties, particularly as regards the breakdown voltage. By suitable thickness of the gate oxide and suitable doping profiles and the side wall oxidation of the gates, it is possible to obtain a breakdown voltage of, for example 15 V.

Figure 15:
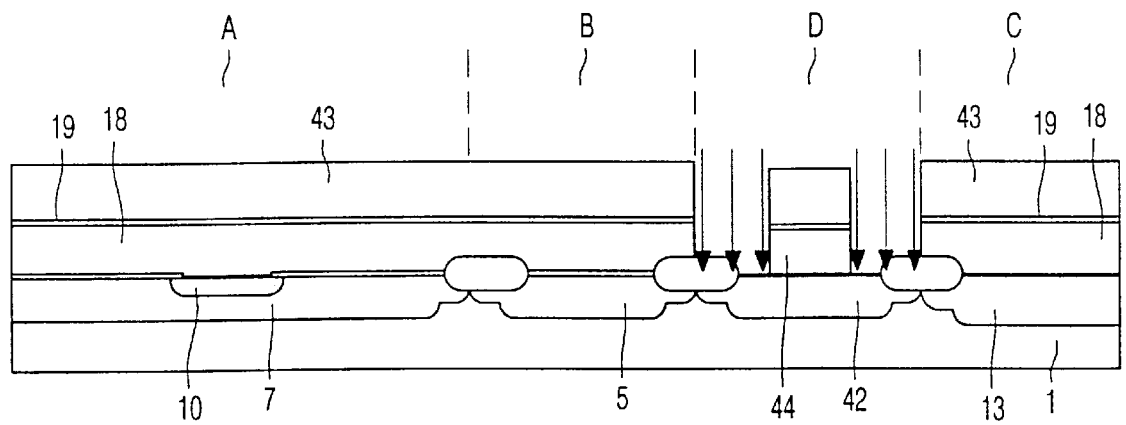
FIGS. 15–18 show a series of stages of a second implementation of a method according to the invention.
Figure 16:
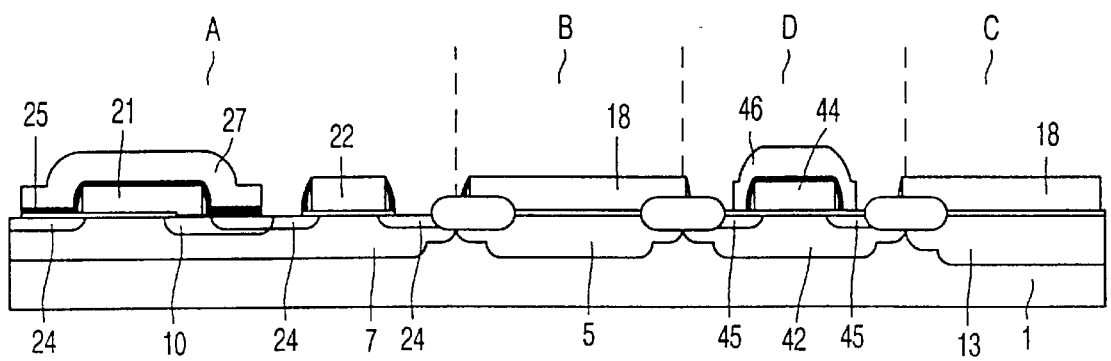
Figure 17:
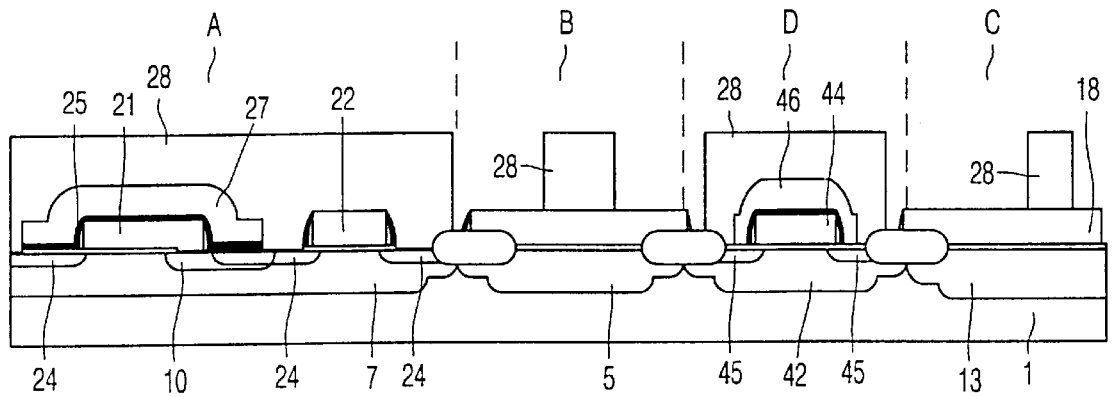

FIGS. 15–18 show several stages of a variant of the process described hereinbefore. An EEPROM cell with the associated selection transistor formed by an n-channel high-voltage transistor is provided in the region denoted by A; a HV p-channel transistor is formed again in region B; region C again serves for the low-voltage CMOS logic, (in which only the n-well 13 with the p-channel transistor is shown in the drawing; the n-channel transistor which is completely identical to the n-channel transistor in region C in the previous example has been omitted so as not to complicate the drawing but it should be taken into account). Moreover, a region D is shown in which a non-volatile memory cell with a floating gate is formed which occupies slightly less space than the EEPROM cell and may be, for example of the Flash type or the OTP type (One Time Programmable). Since most process steps of this variant are identical to process steps described in the previous example, only several steps are shown in the drawing so as to elucidate the difference with the process described hereinbefore. The device is subjected to the same process steps as in FIGS. 1–7, with a p-type well 42 being provided in the region D simultaneously with the p-type well 15 of the low-voltage CMOS logic. After growing the various gate and tunnel oxides on the surface and depositing the first silicon layer 18 and the oxynitride layer 19, a mask 43 is provided which defines the floating gate 44 in region D and masks the regions A, B and C. By way of etching, the floating gate 44 of the further memory cell is then formed so that the stage shown in FIG. 15 is obtained. By means of implantation of As ions with a high dose (denoted by arrows in FIG. 15), the source/drain zones 45 are provided in addition to the floating gate 44. Preferably, B ions are simultaneously implanted so as to obtain p-type doped zones around the n-type source/drain zones with a slightly higher concentration than the background concentration of the p-well. This provides the possibility of forming pn junctions with a steeper doping profile. The doping of these zones (which do not have an LDD structure) is high in connection with generating hot electrons which are required for writing the memory cell. After the implantation, the mask 43 is removed again.

Figure 8:
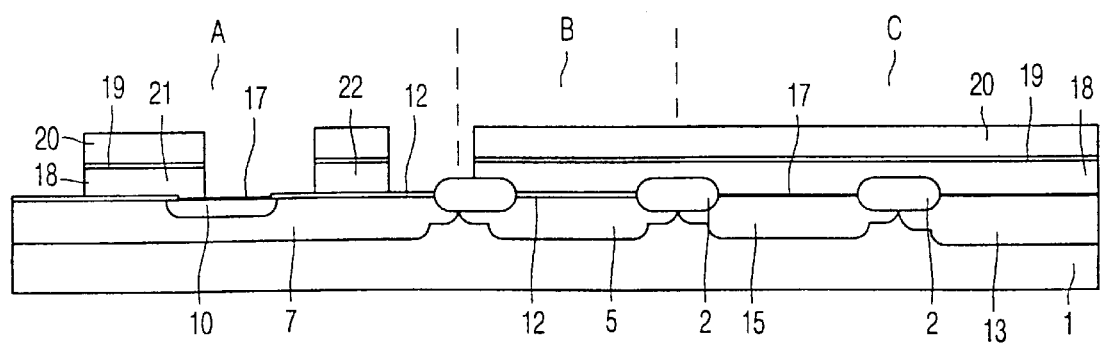
Figure 9:
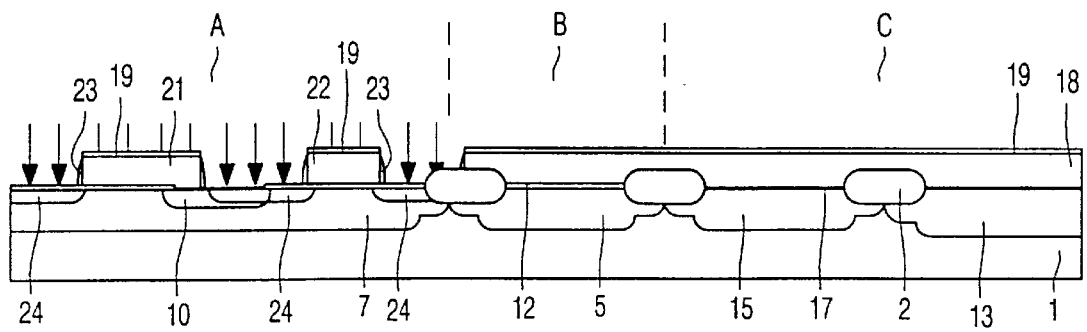
Figure 10:
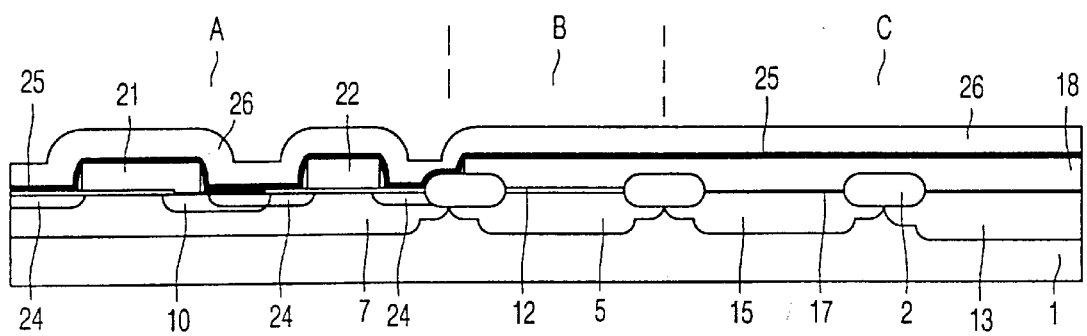
Figure 11:
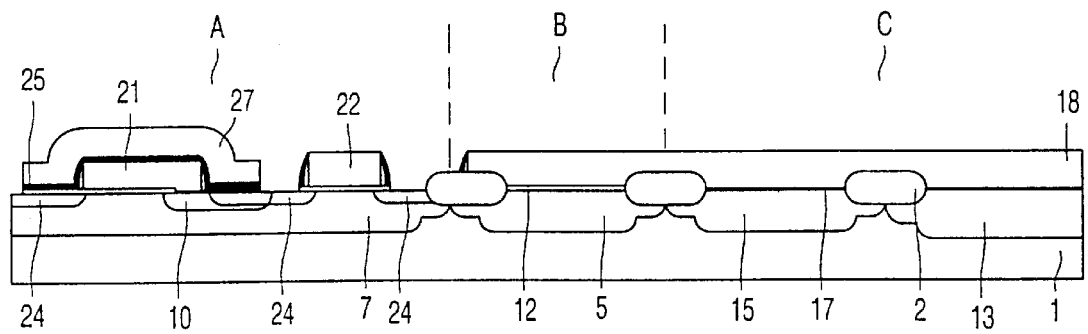
Figure 18:
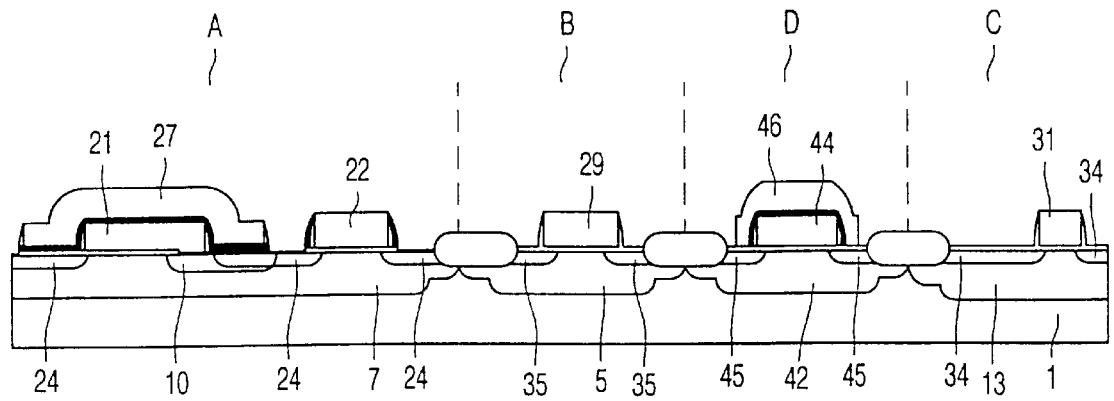

Subsequently, the process steps as shown in FIGS. 8–10 in the previous example are performed. After deposition of the second silicon layer 26, the control gate 46 of the memory cell in region D is formed from the second silicon layer, simultaneously with the definition of the control gate 27 of the EEPROM cell, see FIG. 16. In a subsequent stage, shown in FIG. 17, the mask 28 is provided which defines the gates of the CMOS logic and the gates of the HV p-channel transistors in region B and masks the regions A of the EEPROM and region B. By way of etching, the gates 31 of the logic and the gates 29 of the p-channel high-voltage transistors can then be formed in the remaining parts of the first silicon layer 18 (FIG. 18). Subsequently, the device can be subjected again to the masking and doping steps described hereinbefore. In comparison with the previous example, it is thus possible to add a non-volatile memory of the Flash type or the OTP type to the device by means of only a single extra mask.

It will be evident that the invention is not limited to the embodiments described hereinbefore, but that many variations within the scope of the invention can be conceived by those skilled in the art. For example, the floating gates may be alternatively of the p-conductivity type. Advantageously, the poly gates of the p-channel transistors can be made p-type by redoping.

What is claimed is:

1. A method of manufacturing a semiconductor device, in which a semiconductor body is provided at a surface with a low-voltage field effect transistor and with a non-volatile memory cell in the form of a field effect transistor with a floating gate, in which method the surface is provided with a dielectric layer on which a first polycrystalline or amorphous silicon layer (further referred to as poly) is deposited which is patterned at the location of the memory cell to be formed, whereafter a first doping step is performed for forming source and drain zones of the memory cell, while, during said doping step, the region where the low-voltage transistor is formed is masked against doping by the poly layer, and in a subsequent series of steps the poly layer is patterned at the area of the low-voltage transistor, and source and drain zones of the low-voltage transistor are formed by means of a second doping step, characterized in that the semiconductor body is also provided with a high-voltage field effect transistor having a gate which is patterned simultaneously with the floating gate of the memory cell, while, during the first doping step, the semiconductor body is doped also at the area of the source and drain zones of the high-voltage transistor, whereafter edges of the gate of said transistor are provided with spacers and, during the subsequent, second doping step, higher doped parts are formed in non-masked parts of the source and drain zones of the high-voltage transistor.

2. A method as claimed in claim 1, characterized in that the second doping step is performed with a higher dose of impurities than the first doping step.

3. A method as claimed in claim 1 or 2, characterized in that the dielectric layer is provided in the form of a silicon oxide layer having a larger thickness at the area of the high-voltage transistor than at the area of the low-voltage transistor.

4. A method as claimed in claim 3, characterized in that, prior to depositing the poly silicon layer, the silicon oxide layer is locally provided with a tunnel oxide at the location of the memory cell, where the oxide is so thin that charge carriers can move by means of the tunnel effect between the floating gate and the semiconductor body during writing and/or erasing data.

5. A method as claimed in claim 4, characterized in that, simultaneously with the formation of the tunnel oxide, the low-voltage transistor is provided with gate oxide having a thickness which is equal or at least substantially equal to the thickness of the tunnel oxide.

6. A method as claimed in claim 4, characterized in that the high-voltage transistors and said low-voltage transistor are provided as transistors of the same conductivity type as the transistor with the floating gate, the high-voltage transistor constituting a selection or access transistor of the memory cell.

7. A method as claimed in claim 6, characterized in that at least a further high-voltage transistor and at least a further low-voltage transistor of the opposite, complementary, conductivity type are provided, with gates formed from the first silicon layer simultaneously with the gate of the first-mentioned low-voltage transistor.

8. A method as claimed in claim 7, characterized in that the high-voltage transistor and the low-voltage transistor of the complementary conductivity type are provided in a common doping step with source and drain zones of the second conductivity type.

9. A method as claimed in claim 4, characterized in that, in addition to said memory cell, further referred to as first memory cell, a non-volatile memory cell in the form of a transistor with a floating gate, further referred to as second memory cell, is provided, which is of a type in which writing or erasing takes place by means of hot electrons generated in the channel of the transistor during operation, the floating gate of the second memory cell being defined in a stage where the region of the low-voltage transistor is covered by the polycrystalline silicon layer, and where in the same stage a third doping step is performed so as to obtain source and drain zones of the second memory cell, the third doping step being performed with a higher dose than the first doping step.

10. A method as claimed in claim 9, characterized in that the floating gate and the third doping step are defined prior to defining the floating gate of the first memory cell and the gate of the high-voltage transistor.

* * * * *